United States Patent [19]

Brainard, II

[11] Patent Number: 4,510,551
[45] Date of Patent: Apr. 9, 1985

[54] PORTABLE MEMORY MODULE

[75] Inventor: Edward C. Brainard, II, Marion, Mass.

[73] Assignee: ENDECO Canada Limited, Halifax, Canada

[21] Appl. No.: 612,459

[22] Filed: May 21, 1984

[51] Int. Cl.³ .............................................. H05K 5/00
[52] U.S. Cl. .................................... 361/398; 307/150; 361/395
[58] Field of Search ...................... 429/96, 98, 99, 100, 429/164, 173; 339/17 F, 17 MF; 307/150; 361/331, 334, 380, 390, 395, 398, 399, 424, 386, 388

[56] References Cited

U.S. PATENT DOCUMENTS

| | | |
|---|---|---|
| 2,647,224 | 7/1953 | Bruck . |
| 2,682,018 | 6/1954 | Phillips . |
| 2,703,853 | 3/1955 | Chrystie . |
| 2,892,131 | 6/1959 | MacDonnell . |
| 2,980,874 | 4/1961 | Tarbox . |
| 3,077,563 | 2/1963 | Combs ................................ 307/150 |
| 3,149,406 | 9/1964 | Eisler . |
| 3,337,775 | 8/1967 | Scoles . |
| 3,499,220 | 3/1970 | Hintz . |
| 3,505,570 | 4/1970 | Sprude . |
| 3,517,438 | 6/1970 | Johnson . |
| 3,748,539 | 7/1973 | Seltzer ................................ 361/380 |
| 4,095,412 | 6/1978 | Burke . |
| 4,177,519 | 12/1979 | Kasubuchi . |
| 4,227,236 | 10/1980 | Kulbler . |
| 4,251,852 | 2/1981 | Ecker . |
| 4,261,042 | 4/1981 | Ishiwatari . |
| 4,266,339 | 5/1981 | Kalt . |
| 4,412,272 | 10/1983 | Wedertz ............................. 361/398 |

FOREIGN PATENT DOCUMENTS 1296624  5/1962  France ............................. 361/398

OTHER PUBLICATIONS

TACTI-MEM TM, 4×4 Tactile Membrane Switch Kit, Index page & p. 55, Digital-Key Catalog No. 832, Mar.-Apr. 1983, RE-AL Inc.

Primary Examiner—G. P. Tolin
Attorney, Agent, or Firm—Kenway & Jenney

[57] ABSTRACT

The portable memory module disclosed herein is constructed in a compact cylindrical form facilitating its use in oceanographic and environmental data acquisition environments. Individual integrated circuit memory components are carried and interconnected by a flexible printed circuit, the components being oriented in columns with pin lines parallel to the axis of a cylindrical battery casing to permit the circuit to be rolled around that casing. The battery casing and rolled printed circuit are then inserted in a protective outer casing, also cylindrical.

6 Claims, 6 Drawing Figures

PORTABLE MEMORY MODULE

BACKGROUND OF THE INVENTION

The present invention relates to a portable memory module and more particularly to a battery-powered memory module suitable for data acquisition at remote locations.

In various oceanographic studies, it is desirable to acquire data from sensors over a relatively long period of time at remote locations. For example, the heave buoy manufactured and sold by Endeco, Inc. of Marion, Mass. under the trademark WAVETRACK is adapted to acquire historical information regarding wave height. While telemetry may be effectively used in some situations to transmit the acquired data to a ship- or land-based data acquisition system, there are also situations in which it is preferable to store the data on board the buoy for later retrieval. While tape recorders have commonly been used for such local data acquisition, such devices are mechanical in nature and, even when constructed at high cost for unattended duty, are subject to occasional failures.

Among the several objects of the present invention may be noted the provision of a portable memory module suitable for data acquisition at remote locations; the provision of such a memory module which is suitable for incorporation into an oceanographic buoy; the provision of such a memory module which is of compact configuration and readily incorporated in an oceanographic buoy; the provision of such a memory module which is highly reliable and which is of relatively simple and inexpensive construction. Other objects and features will be in part apparent and in part pointed out hereinafter.

SUMMARY OF THE INVENTION

A portable memory module in accordance with the present invention employs a cylindrical outer casing and, within said outer casing, a cylindrical inner casing generally concentric therewith. Between the inner and outer casings, there is provided a helically-rolled flexible printed circuit carrying and interconnecting a multiplicity of dual-in-line integrated circuit memory components, the components being oriented in columns with the pin lines generally parallel to the axes of the casings. A battery for powering the memory components is held within the inner casing.

BRIEF DESCRIPTION OF THE DRAWINGS

Corresponding reference characters indicate corresponding parts throughout the several views of the drawings.

DESCRIPTION OF THE PREFERRED EMBODIMENTS

Figure 1:
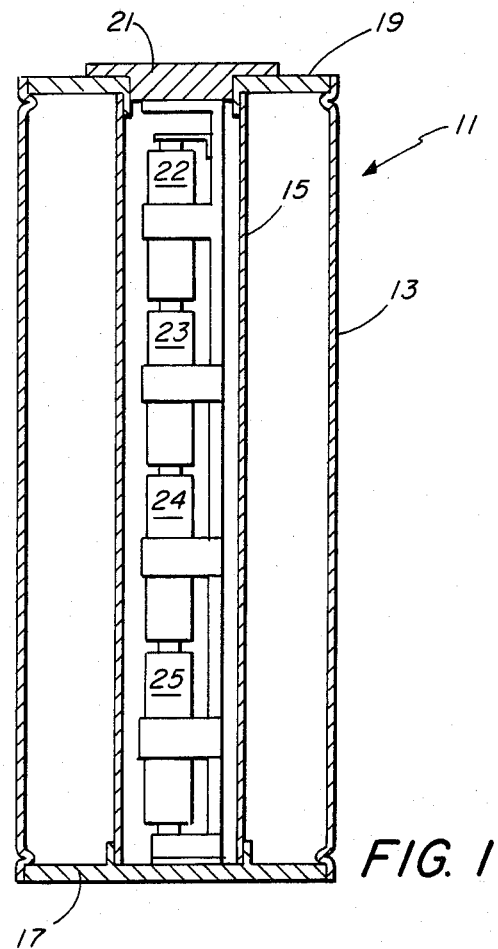
FIG. 1 is a side view, in section, of a cylindrical memory module constructed in accordance with the present invention.

Referring now to FIG. 1, it can be seen that the memory module of the present invention, designated generally by reference character 11, is generally cylindrical in configuration and comprises an outer cylindrical casing 13 and an inner cylindrical casing 15. The casings 13 and 15 are maintained in generally concentric relationship by a disc-like bottom end cap 17 and, at the top end, an annular end cap 19. A cover 21 is provided for closing off the interior of the inner casing 15. The casings 13 and 15 may, for example, be constructed of aluminum tubing while the end caps 17 and 19 may be constructed of a suitable plastic cemented to the tubes. In operation, the inner casing 15 holds batteries, indicated by reference characters 22–25, for powering the electronic memory components of the module.

Figure 3:
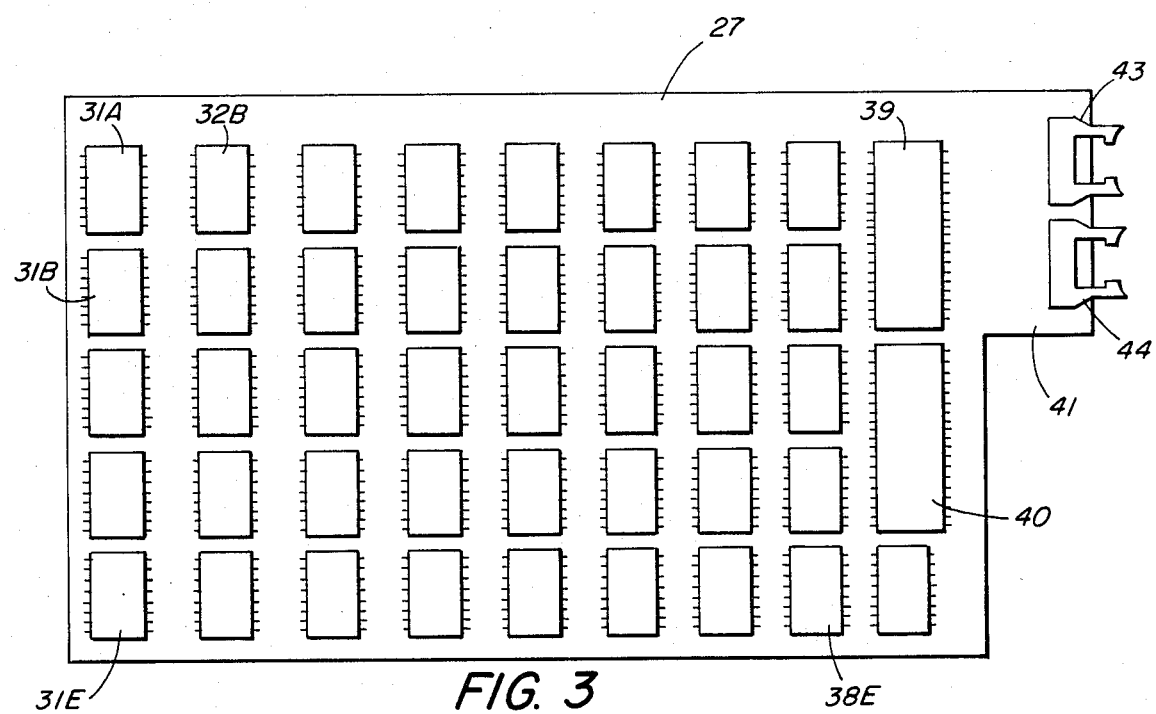
FIG. 3 is a plan view of a flexible printed circuit employed in the memory module of FIGS. 1 and 2.

The electronic memory itself is constructed on a flexible printed circuit 27, the layout of such a printed circuit being shown in FIG. 3. As it is desirable to keep power consumption as low as possible, the memory chips and other electronic components employed are preferably of the complementary metal oxide semiconductor (C-MOS) type. Such components are readily available packaged in the so-called dual-in-line plastic (DIP) configuration. In this configuration, connections to the individual semiconductor devices are made through pins arranged along two parallel lines. As may be seen in FIG. 3, the memory chips, designated 31A–38E, are arranged in rows and columns with the individual integrated circuit memory chips being oriented with their pin lines aligned with the column direction. By arranging the integrated circuit packages in columns with their pin lines parallel and in alignment, the flexibility of the printed circuit 27 is preserved for bending around an axis parallel to the column direction.

Figure 2:
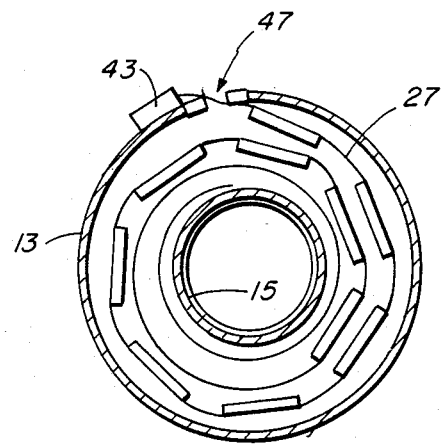
FIG. 2 is a transverse sectional view of the memory module.

As may be seen in FIG. 2, the completed circuit of FIG. 3 is installed in the module by wrapping it helically around the inner casing 15. Preferably, a thin, non-conductive foam sheet is interposed between the successive layers for cushioning and insulation. However, if the integrated circuit packages are all plastic capped and of sufficient height, they may of themselves provide sufficient spacing and air insulation between successive layers.

In addition to the memory chips 31A–38E, the electronic memory circuit will typically also include various interface and/or microprocessor components. As these may involve larger chip sizes, as indicated by reference characters 39 and 40, these components are preferably placed along one side of the printed circuit, i.e. to the right as seen in FIG. 3 and to the outside of the helical wrap configuration as shown in FIGS. 1 and 2. As will be understood, the smaller chip size permit the tighter radius to be formed with the flexible printed circuit. Likewise, in order to accommodate the smaller radius for the initial wraps, the column spacing may be slightly greater for the initial several columns, as shown in FIG. 3, so as to increase the flexibility to the left side of the flexible printed circuit as viewed in FIG. 3.

To facilitate connection of the memory module to the data acquisition sensors and electronics with which it is to co-operate, the flexible printed circuit 27 includes also a tab 41 extending from the right side of the main rectangular section of the circuitry and this tab carries a pair of flat edge cable connectors 43 and 44. Preferably, the memory circuitry is arranged to incorporate serial data communication so that the number of leads that must be brought out is relatively small.

Figure 4:
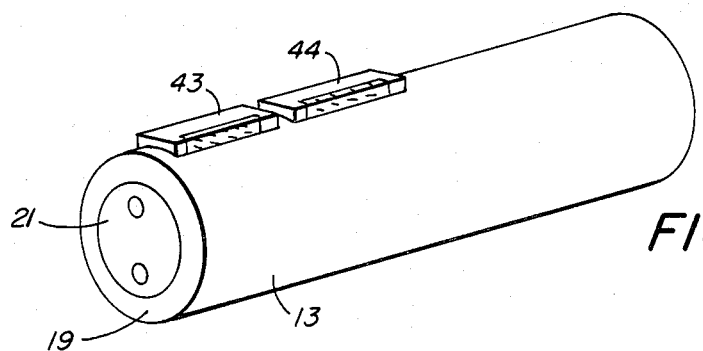
FIG. 4 is a perspective view of the complete memory module of FIGS. 1 and 2.

As may be seen in FIG. 2, the upper end of the outer casing 13 provides a longitudinal slit, designated generally by reference character 47. Upon assembly of the module, the tab 41 is led through this slit so that the connectors 43 and 45 reside outside the outer casing 13, as may best be seen in FIGS. 2 and 4. After the circuit is installed between the inner and outer casings and the end caps are mounted in place, a suitable sealant is preferably applied to the region where the tab passes through the slit and the connectors 43 and 44 are cemented to the outside of the casing.

Figure 5:
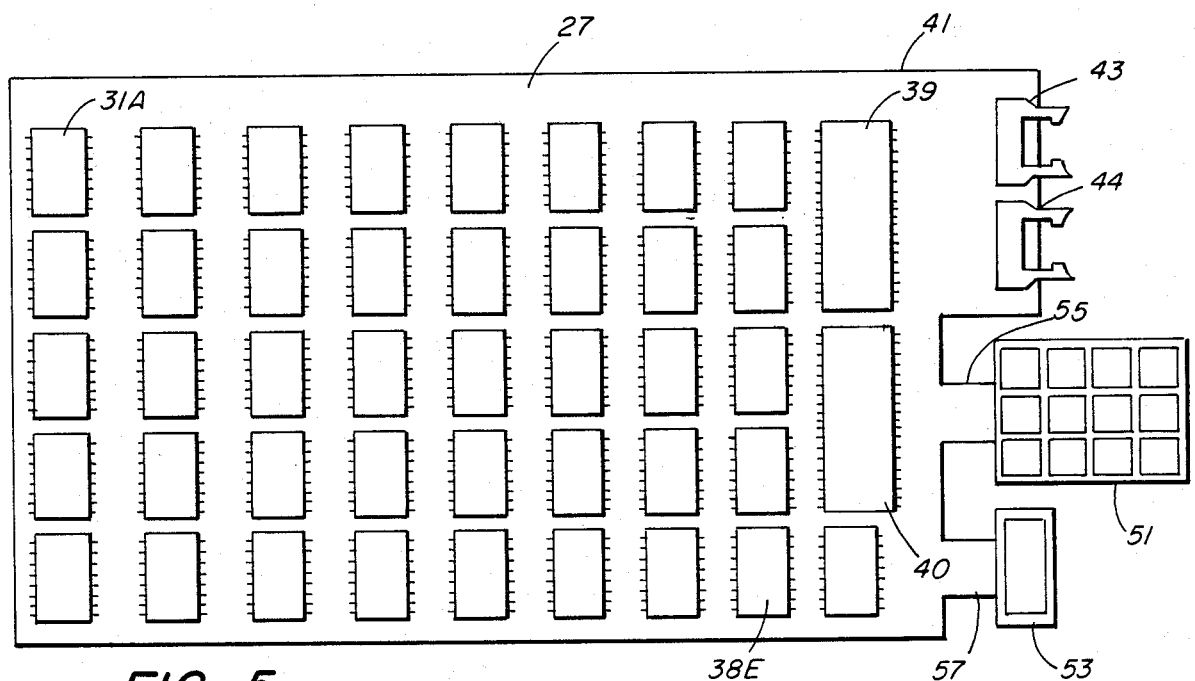
FIG. 5 is a plan view of a flexible printed circuit employed in an alternative embodiment.
Figure 6:
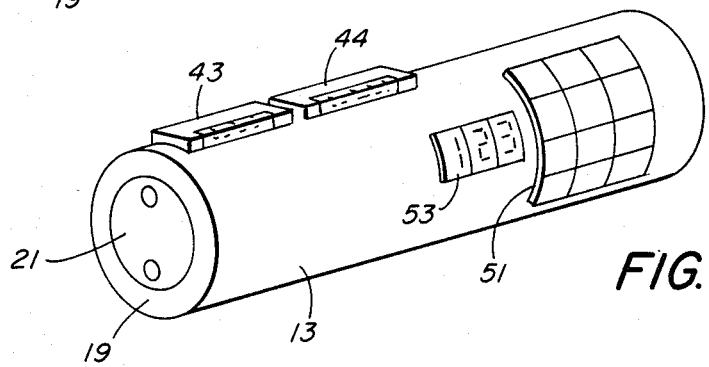
FIG. 6 is a perspective view of the alternative embodiment fully assembled.

In some situations, it may be desirable to incorporate user I/O (input/output) capabilities for facilitating the transfer of data to other devices. In such cases, a flexible key pad 51 and LCD readout 53 may be attached, as illustrated a FIG. 5, to the flexible printed circuit by tabs 55 and 57 similar to tab 41 and these components can then be mounted on the outside of the casing 13 in the same manner as the connectors 43 and 45. Such a configuration is illustrated in FIG. 6.

In view of the foregoing, it may be seen that several objects of the present invention are achieved and other advantageous results have been obtained.

As various changes could be made in the above constructions without departing from the scope of the invention, it should be understood that all matter contained in the above description or shown in the accompanying drawings shall be interpreted as illustrative and not in a limiting sense.

What is claimed is:

1. A portable memory module comprising:
a cylindrical outer casing;
a cylindrical inner casing generally concentric with said outer casing;
between said inner and outer casings, a rolled, flexible printed circuit carrying and interconnecting a multiplicity of integrated circuit memory components; and
within said inner casing, a battery for powering said memory components.

2. A portable memory module comprising:
a cylindrical outer casing;
a cylindrical inner casing generally concentric with said outer casing;
between said inner and outer casings, a helically rolled printed circuit carrying and interconnecting a multiplicity of dual-in-line integrated circuit memory components oriented in columns with the pin lines parallel to the axes of said casings; and
within said inner casing, a battery for powering said memory components.

3. A portable memory module as set forth in claim 2 wherein the spacing of the memory component columns is greater on the portion of the printed circuit which is adjacent the inner casing than on the portion which is on the outer portion of the helical rolling.

4. A portable memory module as set forth in claim 2 wherein said outer casing includes a longitudinal slit adjacent one end and said printed circuit includes a tab extending through said slot for providing electrical connections outside of said outer casing.

5. A portable memory module comprising:
a cylindrical outer casing;
a cylindrical inner casing generally concentric with said outer casing;
an end cap closing off said inner and outer casings at one end;
between said inner and outer casings, a helically rolled flexible printed circuit carrying and interconnecting a multiplicity of dual-in-line integrated circuit memory components oriented in columns with the pin lines parallel to the axes of said casings;
an annular cap closing off, at the other ends of said casings, the space between said casings
within said inner casing, a battery for powering said memory components; and a removable cap for closing off the other end of said inner casing.

6. A portable memory module as set forth in claim 5 wherein said outer casing includes a longitudinal slit adjacent one end and said printed circuit includes a tab extending through said slot for providing electrical connections outside of said outer casing.

* * * * *